(12) United States Patent
Tiemeijer et al.

(10) Patent No.: US 8,981,433 B2
(45) Date of Patent: Mar. 17, 2015

(54) COMPENSATION NETWORK FOR RF TRANSISTOR

(75) Inventors: Lukas Frederik Tiemeijer, Eindhoven (NL); Vittorio Cuoco, Nijmegen (NL); Rob Mathijs Heeres, Nijmegen (NL); Jan Anne van Steenwijk, Eindhoven (NL); Marnix Bernard Willemsen, Eindhoven (NL); Josephus Henricus Bartholomeus van der Zanden, Best (NL)

(73) Assignee: NXP, B.V., Eindhoven (NL)

( * ) Notice: Subject to any disclaimer, the term of this patent is extended or adjusted under 35 U.S.C. 154(b) by 430 days.

(21) Appl. No.: 13/304,215

(22) Filed: Nov. 23, 2011

(65) Prior Publication Data
US 2012/0132969 A1    May 31, 2012

(30) Foreign Application Priority Data
Nov. 29, 2010 (EP) .................................. 10192922

(51) Int. Cl.
*H01L 23/66* (2006.01)
*H01L 23/522* (2006.01)
(Continued)

(52) U.S. Cl.
CPC ............ *H01L 23/66* (2013.01); *H01L 23/5223* (2013.01); *H01L 23/642* (2013.01); *H01L 24/48* (2013.01); *H01L 24/49* (2013.01); *H01L 2223/6611* (2013.01); *H01L 2223/6644* (2013.01); *H01L 2223/6655* (2013.01); *H01L 2224/4809* (2013.01); *H01L 2224/49111* (2013.01); *H01L 2224/49175* (2013.01); *H01L 2924/01013* (2013.01); *H01L 2924/01029* (2013.01); *H01L 2924/01033* (2013.01); *H01L 2924/01073* (2013.01); *H01L 2924/01079* (2013.01); *H01L 2924/014* (2013.01); *H01L 2924/19051* (2013.01); *H01L 2924/01005* (2013.01); *H01L 2924/01006* (2013.01);
(Continued)

(58) Field of Classification Search
CPC ....... H01L 23/66; H01L 23/642; H01L 24/48; H01L 24/49
USPC .................. 257/257, 277, 531, 528, E21.022; 333/32, 33
See application file for complete search history.

(56) References Cited

U.S. PATENT DOCUMENTS

| 4,900,913 A | 2/1990 | Muro |
| 2004/0150489 A1* | 8/2004 | Driver et al. ................... 333/32 |

(Continued)

FOREIGN PATENT DOCUMENTS

| JP | 6 005794 A | 1/1994 |
| WO | 2009/128035 A1 | 10/2009 |

OTHER PUBLICATIONS

Extended European Search Report for EP Patent Appln. No. 10192922.2 (May 10, 2011).

*Primary Examiner* — Selim Ahmed

(57) ABSTRACT

A compensation network for a radiofrequency transistor is disclosed. The compensation network comprises first and second bonding bars for coupling to a first terminal of the RF transistor and a compensation capacitor respectively; one or more bond wires coupling the first and second bonding bars together; and a compensation capacitor formed from a first set of conductive elements coupled to the second bonding bar, the first set of conductive elements interdigitating with a second set of conductive elements coupled to a second terminal of the RF transistor.

13 Claims, 5 Drawing Sheets

(51) Int. Cl.
*H01L 23/64* (2006.01)
*H01L 23/00* (2006.01)

(52) U.S. Cl.
CPC .......... *H01L2924/01019* (2013.01); *H01L 2924/01023* (2013.01); *H01L 2224/48195* (2013.01); *H01L 2224/48091* (2013.01); *H01L 2924/00014* (2013.01); *H01L 2924/10253* (2013.01); *H01L 2924/3011* (2013.01); *H01L 2924/30107* (2013.01)
USPC .............. 257/275; 257/296; 257/E21.022

(56) References Cited

U.S. PATENT DOCUMENTS

| | | | |
|---|---|---|---|
| 2006/0226451 A1* | 10/2006 | Davies | 257/210 |
| 2006/0270145 A1 | 11/2006 | Bach | |
| 2007/0057344 A1* | 3/2007 | Lee | 257/532 |
| 2010/0177457 A1 | 7/2010 | Willard | |
| 2010/0238603 A1* | 9/2010 | Chung | 361/301.4 |

* cited by examiner

COMPENSATION NETWORK FOR RF TRANSISTOR

This application claims the priority under 35 U.S.C. §119 of European patent application no. 10192922.2, filed on Nov. 29, 2010, the contents of which are incorporated by reference herein.

FIELD OF THE INVENTION

The invention relates to a compensation network for a radiofrequency (RF) transistor, and to a RF transistor module comprising a RF transistor and one or more such compensation networks.

BACKGROUND OF THE INVENTION

FIG. 1 shows an example of a discrete RF-LDMOS (Laterally Diffused Metal Oxide Semiconductor) power amplifier transistor module 1. The module comprises a RF transistor die 2, and a matching network consisting of bond wires 3a, 3b and two discrete capacitors 4a, 4b. The gate and drain are coupled to terminals 5 and 6 respectively via bond wires. The source is coupled to mounting plate 7 via conductive solder between the terminal 7 and the silicon substrate. The mounting plate 7 thus acts as the source terminal.

The RF-LDMOS die is a very specialized transistor where a lot of special measures are taken to optimize its performance with respect to power efficiency (i.e. the ratio between consumed DC power and delivered RF power). Such a transistor has for instance been described in WO 2009/128035.

At a typical operating frequency of 2 GHz, the input and output impedances of this transistor contain resistive and reactive components. The reactive component is usually capacitive. The reactive component causes a reactive current to flow, which can cause losses due to parasitic resistances in the transistor module 1. These losses reduce the power efficiency of the transistor. Also, the reactive currents do not contribute to the output power.

The purpose of the inductance $L_j$, which is provided by bond wires 3b between the drain bonding pads on the transistor die 2 and the capacitor 4b, is to introduce an appropriate amount of inductive current, which should, at the intended operating frequency, approximately compensate the capacitive current. The discrete decoupling capacitance $C_{po}$ (i.e. capacitor 4b) is needed to ensure that the drain of the RF-LDMOS die 2 can be biased with the desired DC voltage. When decoupling is the only desired function of this capacitance, its value should be fairly large, so that at the operating frequency of the transistor it has a low impedance compared to the impedance of the bond wire L.

The drain of the transistor 2 is connected to the drain contact 6 of the package with bond wires, which together have inductance $L_d$. This compensation scheme for the reactive output current brings the output impedance to a more practical level. Although very effective, it only works at a limited frequency range and is therefore mostly suitable for narrow-band applications.

At the input, a different matching network topology has been used. Here again the purpose of the inductance $L_{g1}$ is to compensate the capacitive component of the input impedance at the intended operating frequency, and thus bring the input impedance to a more practical level. However, now this impedance matching is done in two stages, the first stage being formed by $L_{g2}$ and $C_{pr}$ (i.e. capacitor 4a), and the second stage being formed by $L_{g1}$. This topology acts as a low-pass filter and generally has a wider bandwidth than the output matching network.

The two impedance matching topologies shown here are only two of the many solutions available to those skilled in the art, which all aim to compensate reactive parts of impedances and/or transform the remaining resistive impedances to more practical levels.

Since the reactive currents in the transistor can be very high, the resistive losses in the input and output matching networks can be significant. Any resistive losses in the input matching network will reduce the power gain, and any resistive losses in the output matching network will reduce the power gain and also the power efficiency and the maximum power available from the device.

Contrary to what might be expected at first glance, the RF currents only flow in the surface of the transistor module 1 parts due to the skin effect. In the metal parts this skin depth is about 2 µm at a frequency of 2 GHz. In the silicon die 1, this skin depth is about 100 µm at the same frequency. The resistance seen by the currents flowing in the transistor module 1 is the skin resistance, which is the specific bulk resistance divided by the skin depth.

In the module 1 shown in FIG. 1, the resistance seen by the inductive compensation current is the sum of the bond wire resistance (which is given by the product of the skin resistance of the bond wire material and the bond wire length divided by the bond wire circumference (π×the bond wire diameter) and the number of parallel bond wires), the equivalent series resistance (ESR) of the parallel capacitor, the skin resistance of the mounting plate (which is roughly the product of the skin resistance of the mounting plate material and the die to parallel capacitor separation divided by the die and parallel capacitor width), and the skin resistances of the sides of the transistor's die 2 and parallel capacitor 4a, 4b chips (which is the product of the skin resistance of the conductive silicon and the chip height divided by the chip width). For a typical chip height of 175 µm, the chip side resistances may well provide over 75% of the total compensation-circuit series resistance and reduce the Q-factor of the compensation circuit from 80 to below 20.

The undesirable chip-side resistive losses could be eliminated by integrating the parallel capacitors with the RF-LDMOS transistor on a single die. However, the distance between the capacitors 4a, 4b and the die 2 cannot be substantially reduced by integration since the bond wires need to be sufficiently long to provide high Q-factor inductances. Therefore, integration would not provide the usual cost benefits, since the required amount of silicon area is actually increased, which would offset the cost savings of not having to use a multi-chip module.

SUMMARY OF THE INVENTION

According to the invention, there is provided a compensation network for a radiofrequency (RF) transistor comprising first and second bonding bars for coupling to a first terminal of the RF transistor and a compensation capacitor respectively; one or more bond wires coupling the first and second bonding bars together; and a compensation capacitor formed from a first set of conductive elements coupled to the second bonding bar, the first set of conductive elements interdigitating with a second set of conductive elements coupled to a second terminal of the RF transistor.

Hence, the invention provides a means for manufacturing a compensation capacitor (which can be integrated on the same silicon die as the transistor), which provides a much lower equivalent series resistance (ESR) than prior art capacitors because the interdigitating elements can provide such a large surface area at close separation. The resistive losses are thereby substantially reduced.

Preferably, the first and second bonding bars are spaced apart to define a region for placement of the compensation capacitor, the compensation capacitor preferably occupying substantially the entire region.

This maximises the area occupied by the capacitor, which ensures that the ESR is minimised.

By "occupying substantially the entire region", we mean that the first and second sets of conductive elements occupy the entire region except for any gaps necessary to prevent short-circuiting between the first and second sets of conductive elements and for defining the required capacitance.

The first and second bonding bars may be spaced apart by a predefined distance, the predefined distance being selected such that the bond wires have a desired inductance.

Typically, the first and/or second sets of conductive elements are formed in an upper metal layer disposed above a silicon substrate on which the RF transistor is formed. Thus, the capacitor may be integrated on the silicon die with the transistor and when the transistor occupies substantially the entire region between the two bonding bars very little additional silicon area is required. This is because the bond wires have to span from the first bonding bar, across the compensation capacitor, to the second bonding bar. They therefore provide the required inductance without wasting silicon area.

Furthermore, at a typical operating frequency of 2 GHz the skin resistance of the upper metal layer in a silicon chip will tend to have a lower skin resistance than that of the mounting plate due to a lower surface roughness.

The second set of conductive elements may be coupled to the second terminal of the RF transistor by way of one or more vias and/or one or more intermediate metal layers disposed between the silicon substrate and the upper metal layer.

This provides a very low resistance connection between the capacitor and the second terminal (usually the source) of the transistor, especially when the upper metal layer is used for the second set of conductive elements.

In one embodiment, one of the intermediate metal layers extends underneath at least some of the first set of conductive elements. This increases the capacitive coupling available.

In another embodiment, at least some of the first set of conductive elements are coupled to a metal layer lying above, but electrically isolated from, one of the intermediate metal layers. The electrical isolation may be provided by silicon dioxide or by a high-k dielectric such as tantalum pentoxide. This is another way of increasing the capacitive coupling.

Typically, the bonding bars and/or the conductive elements are made from a metal, preferably aluminium, copper or gold, which may be useful due to its comparatively low resistivity.

The first terminal may be the gate or drain of the RF transistor, and the second terminal may be the source of the RF transistor.

Alternatively, if the RF transistor is a bipolar transistor, the first terminal may be the base or collector of the RF transistor, and the second terminal may be the emitter of the RF transistor.

In accordance with a second aspect of the invention, there is provided a RF transistor module comprising a RF transistor and a first compensation network according to the first aspect of the invention, the first bonding bar of the first compensation network being coupled to one of the gate or drain of the RF transistor respectively and the second conductive elements of the first compensation network being coupled to the source of the RF transistor.

The RF transistor module may further comprise a second compensation network according to the first aspect of the invention, the first bonding bar of the second compensation network being coupled to the other of the gate or drain of the RF transistor respectively and the second conductive elements of the second compensation network being coupled to the source of the RF transistor.

The RF transistor is preferably manufactured on the same substrate as the first and/or second compensation networks.

The substrate may be a silicon substrate or it may be another semiconductor, such as gallium arsenide.

In accordance with the third aspect of the invention, there is provided, a cellular base station or terrestrial broadcast station comprising an RF transistor module according to the second aspect of the invention.

BRIEF DESCRIPTION OF THE DRAWINGS

Examples of the invention will now be described in detail with reference to the accompanying drawings, in which.

DETAILED DESCRIPTION OF EMBODIMENTS

Figure 1:
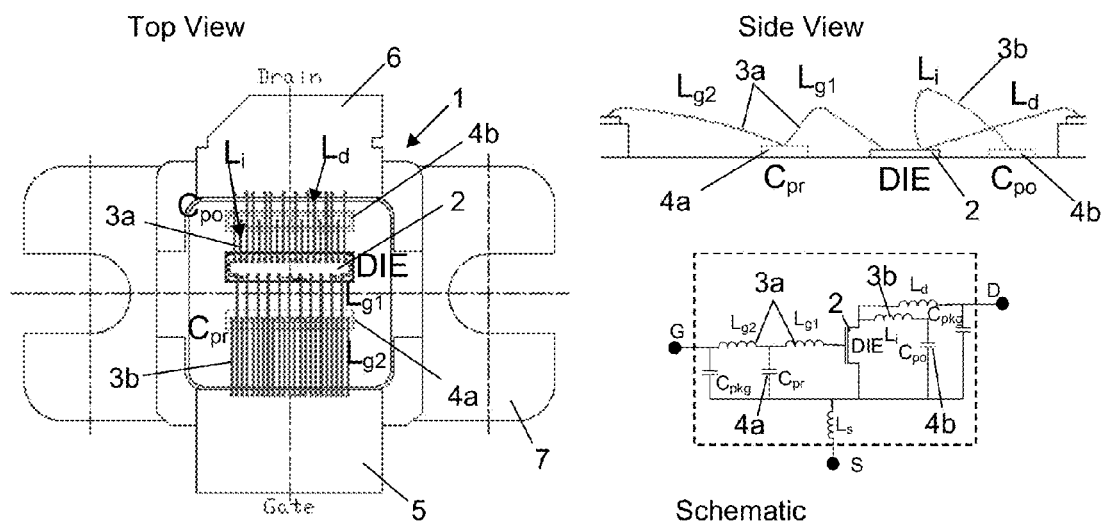
FIG. 1 shows a prior art RF-LDMOS transistor module.
Figure 2:
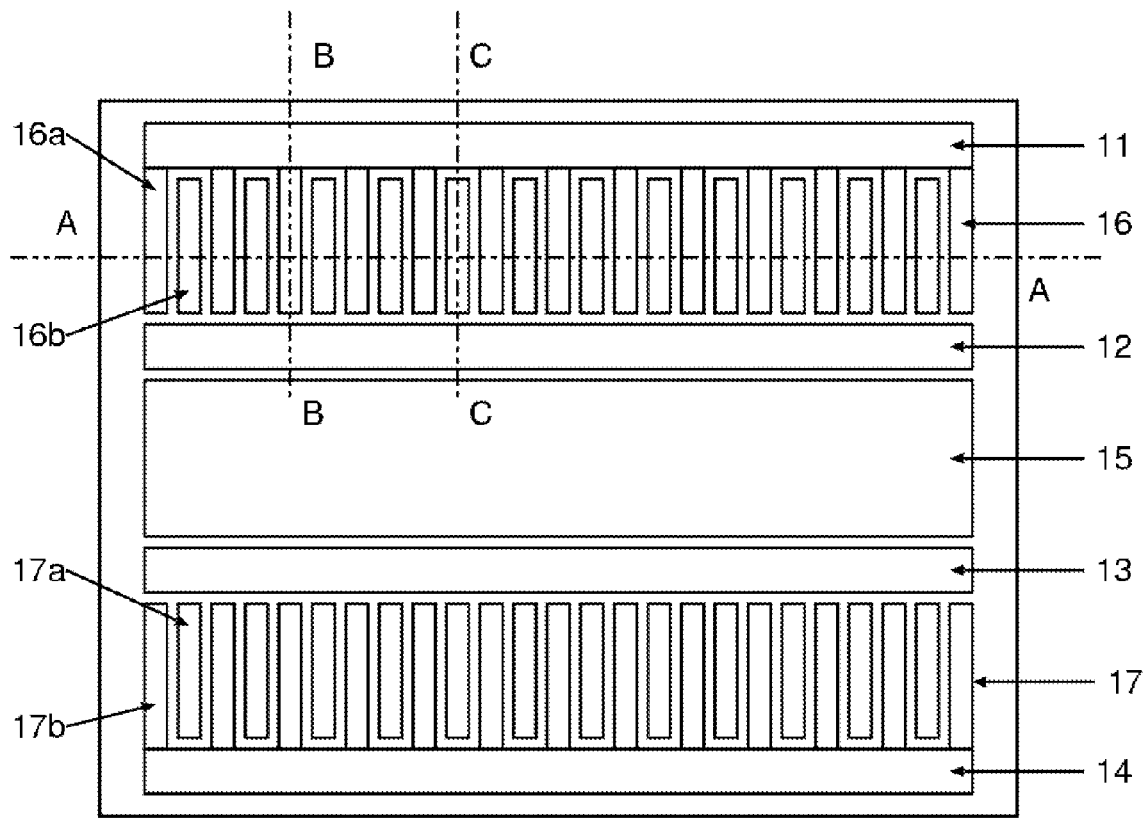
FIG. 2 shows schematically the layout of a transistor with compensation network according to the invention.

FIG. 2 shows a power RF LD-MOS transistor 15 using a compensation network according to the invention. The transistor 15 is provided on a silicon substrate 10. Its gate is connected to the gate bond bar 12 and its drain connected to the drain bond bar 13. The transistor 15 typically contains interconnect lines in various metal layers connecting the poly-silicon gates to the gate bond bar 12 and the drain implantation regions to the drain bond bar 13. The source is connected to a mounting plate in a package (similar to that shown in FIG. 1) when the transistor is assembled into a module. Furthermore, the transistor 15 contains interconnect lines in various metal layers to connect the source implantation regions with the second set of conductive elements which form one terminal of the compensation capacitor.

Although not shown, a parallel group of bond wires couples bond bar 11 to bond bar 12 and another parallel group of bond wires couples bond bar 13 to bond bar 14. Thus, the gate is also electrically connected to bond bar 11 and the drain is also electrically connected to bond bar 14. During assembly into a module, further bond wires will couple the gate to an external terminal on the module, either via bond bar 11 or bond bar 12. Similarly, the drain will be coupled to another external terminal either via bond bar 13 or bond bar 14.

Bond bar 11 is coupled to a compensation capacitor 16 and bond bar 14 is coupled to a compensation capacitor 17. The compensation capacitors 16 and 17 occupy substantially the entire area between the bond bars 11 and 12 and bond bars 13 and 14 respectively. Compensation capacitor 16 comprises two sets of interdigitating conductive elements 16a, 16b. Similarly, compensation capacitor 17 also comprises two sets of interdigitating conductive elements 17a, 17b. The first set of conductive elements 16a, 17a in each capacitor 16, 17 acts as a first comb electrode, whereas the second set of conductive elements 16b, 17b acts as a second comb electrode. These comb electrodes offer multiple parallel paths for the current to flow along. Therefore, even though at high frequencies the skin effect restricts the current flow to the surface of the comb electrodes, the multiple parallel paths ensure that the resistance is significantly reduced.

As can be seen, the capacitors 16 and 17 are integrated onto the same silicon substrate 10 as the transistor 15, and the layout allows the bond wires to have an appropriate length without requiring a large amount of additional wasted silicon area as the capacitors 16 and 17 occupy the area underneath the bond wires.

Figures 3A, 3B:
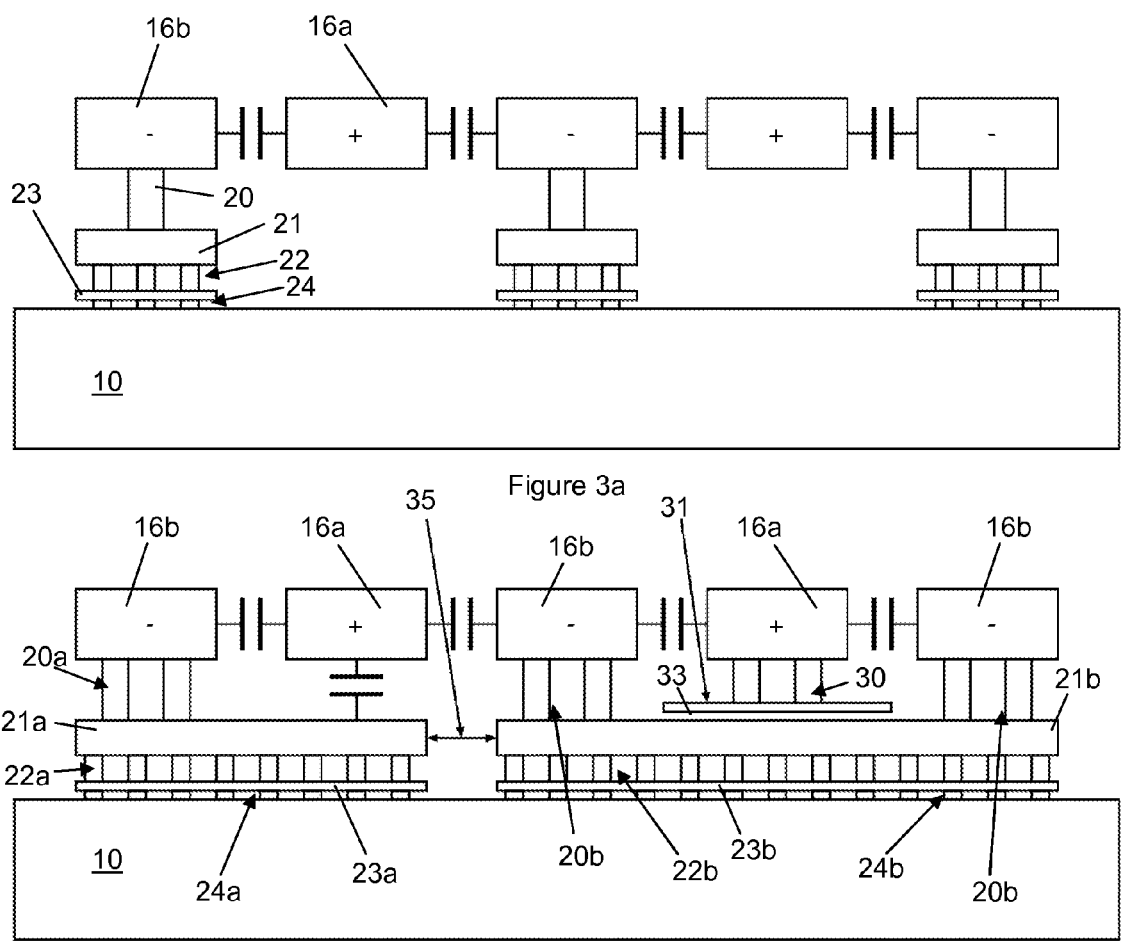
FIGS. 3a and 3b shows cross-sections along A-A of two variants of the transistor of FIG. 2.

FIGS. 3a and 3b show cross-section along the line A-A in FIG. 2 for two variants of the compensation network. FIG. 3a shows the construction of a basic capacitor for use with this invention. Here, the conductive elements 16a, 16b are shown in cross-section and the lateral capacitances between them are indicated. The conductive elements are isolated from each other by a dielectric material like silicon dioxide (not shown). FIG. 3a also shows how conductive elements 16b could be connected to the source of the transistor. This is an optional connection since the transistor 15 will likely already contain interconnect lines in various metal layers to connect the source implantation regions with the conductive elements 16b. Specifically, the conductive elements 16b (which are formed in a top metal layer along with conductive elements 16a, 17a and 17b) are connected by vias 20 to a plate 21 formed in a first intermediate metal layer. Three vias 22 couple the plate 20 to another plate 23 in a second intermediate metal layer. The plate 23 is then coupled by three more contacts 24 to the silicon substrate 10.

FIG. 3b shows two ways in which the capacitance of capacitors 16, 17 may be increased, should this be required. In the first way, a conductive element 16b is coupled to a plate 21a formed in the first intermediate metal layer by vias 20a. The plate 21a is sufficiently enlarged that it extends underneath the conductive element 16a. Thus, the conductive element 16a is capacitively coupled with the plate 21a. The plate 21a is coupled to another plate 23a by vias 22a and this plate 23a is coupled by contacts 24a to the silicon substrate 10. In effect, the extended width of plate 21a increases the area of capacitive coupling in capacitors 16, 17.

Another way of achieving this effect is shown towards the right hand side of FIG. 3b, where a metal-insulator-metal capacitor (MIMCAP) is formed. The conductive elements 16b are coupled to a plate 21b formed in the first intermediate metal layer by vias 20b. The conductive element 16a is coupled by vias 30 to a plate 31 formed in a third intermediate metal layer. The plate 31 lies parallel to and spaced apart from plate 21b. The plates 31 and 21b are in close proximity and have an insulating high-k dielectric layer 33 between them. Suitable dielectrics are, for instance, silicon nitride or tantalum pentoxide. Thus, the plates 31 and 21b form another capacitor in parallel with the capacitances between the side walls of conductive elements 16a, 16b. Again, the plate 21b is coupled to the silicon substrate 10 by way of vias 22b, 24b and a plate 23b formed in the second intermediate metal layer.

The plates 31 and 21b may need to be limited in size to satisfy fabrication rules, which prohibit the use of large areas of solid metal, due to the difference in thermal expansion compared to the silicon substrate. Thus, slots 35 may be formed in the first intermediate metal layer to limit the size of the plates 31 and 21b.

Both of the two ways of increasing capacitance shown in FIG. 3b can be used alone or together. Furthermore, the slot 35 need not be underneath the gap between conductive elements 16a and 16b. It can instead be underneath one of the conductive elements 16a.

Figure 4A:
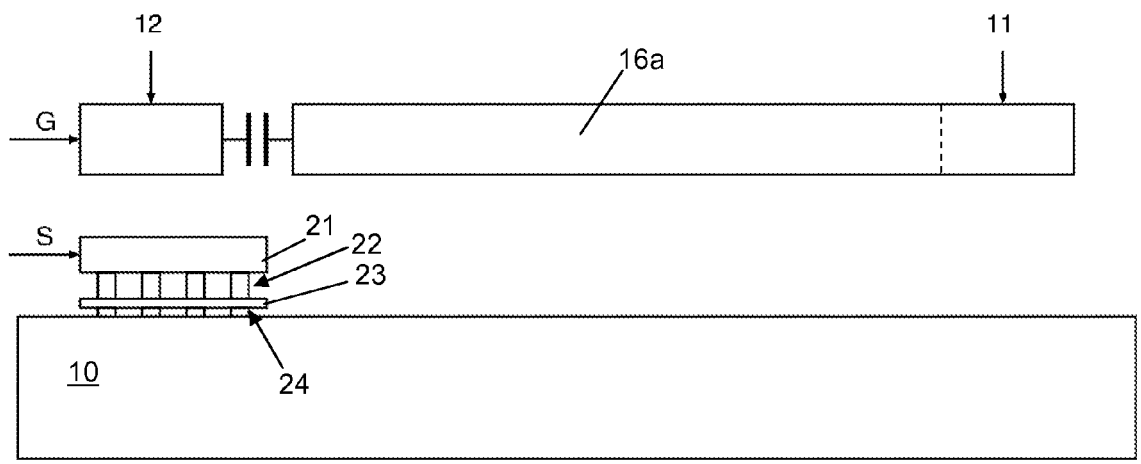
FIGS. 4a and 4b shows cross-sections along B-B of the two variants.
Figure 4B:
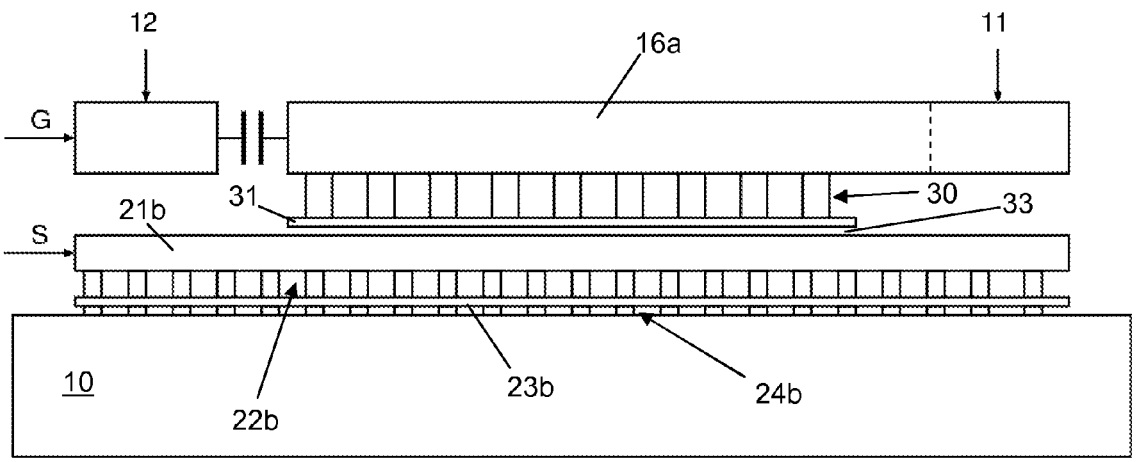

FIGS. 4a and 4b shows a part of the cross-section along B-B for the two variants of FIGS. 3a and 3b. FIG. 4a corresponds to FIG. 3a, whereas FIG. 4b shows the MIMCAP described above with reference to the right hand side of FIG. 3b. In FIG. 4a, the cross-section shows the view through one of the conductive elements 16a, which are not coupled by vias to the source of the transistor. Thus, the vias 20, 22 and 24, and plates 21 and 23 do not extend beyond the bond bar 12 underneath the conductive element 16a as this is not connected to the source of the transistor.

Figure 5:
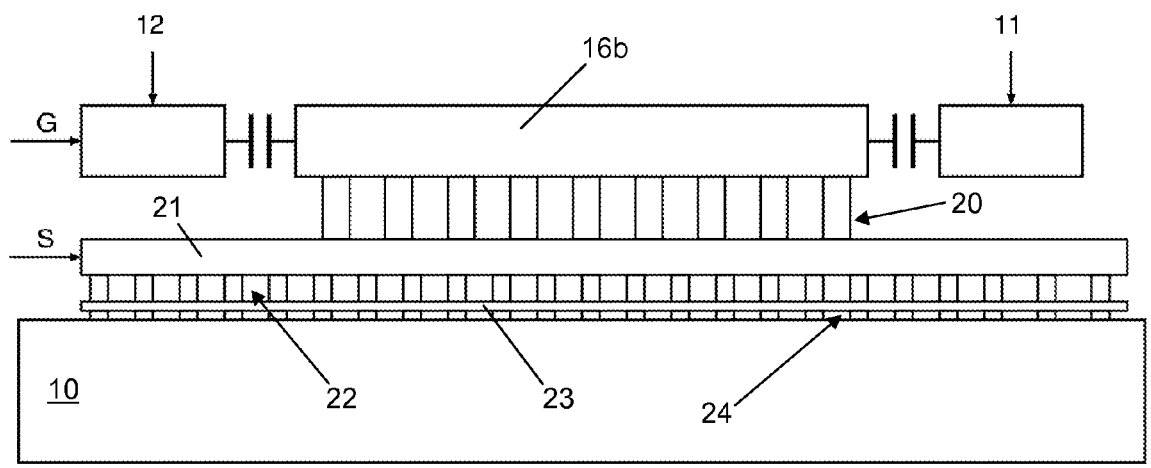
FIG. 5 shows a cross-section along C-C of the transistor of FIG. 2.

FIG. 5 shows a part of the cross-section along C-C. To achieve the best possible coupling between the conductive element 16b and the source, the conductive element 16b is connected over its full length by vias 20 to the plate 21, which in turn is tied to the substrate 10 over its full length via the plate 23 and vias 22 and 24.

A well known disadvantage of integration is the loss of design flexibility. Here, however, the inductances in the matching circuits can be changed fairly easily by changing the number of parallel bond wires between the bond bars 11 and 12 and between the bond bars 13 and 14 and/or the bond wire height and shape. Furthermore, when the MIMCAP option is used, only the MIMCAP mask and one via mask have to be modified to change the value of the capacitances of capacitors 16, 17.

The RF-LDMOS die described above can be used in any power amplifier transistor for use in cellular base stations or terrestrial transmission applications where its specific benefits are considered useful. The invention is not limited to LDMOS transistors realized in processes with three metal layers. This is just an example. The invention applies for any number of metal layers bigger than one, and could also be very relevant for III-V processes employing isolating substrates for instance composed of gallium arsenide or gallium nitride. Obviously the invention is not restricted to the symmetric example discussed here with one parallel capacitor at the input and one at the output. It might be beneficial to omit one of the compensation networks or use more impedance matching stages with more integrated parallel capacitors of the type described here. The invention can therefore also be used in RF power amplifier products involving more complicated matching networks which might be considered useful for certain demanding applications by those skilled in the art.

Other variations to the disclosed embodiments can be understood and effected by those skilled in the art in practising the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. Any reference signs in the claims should not be construed as limiting the scope.

The invention claimed is:

1. A compensation network for a radiofrequency transistor comprising first and second bonding bars for coupling to a first terminal of the RF transistor and a compensation capacitor respectively; one or more bond wires coupling the first and second bonding bars together; and a compensation capacitor formed from a first set of conductive elements coupled to the second bonding bar, the first set of conductive elements interdigitating with a second set of conductive elements coupled to a second terminal of the RF transistor, wherein each of the second set of conductive elements is coupled to the RF transistor sequentially through a first single via, a first intermediate metal layer, a second set of vias, a second intermediate metal layer and a third set of vias, the first and second bonding bars are spaced apart to define a region for placement of the compensation capacitor, the compensation capacitor occupying substantially the entire region, characterised in that the first and second bonding bars are spaced apart by a predefined distance, the predefined distance being selected such that the bond wires have a desired inductance, wherein the first set of conductive elements and the second set of conductive elements are isolated from each other by a dielectric material.

2. A compensation network according to claim 1, wherein the first and/or second sets of conductive elements are formed in an upper metal layer disposed above a silicon substrate on which the RF transistor is formed.

3. A compensation network according to claim 2, wherein the second set of conductive elements is coupled to the second terminal of the RF transistor by way of one or more vias and/or one or more intermediate metal layers disposed between the silicon substrate and the upper metal layer.

4. A compensation network according to claim 3, wherein one of the intermediate metal layers extends underneath at least some of the first set of conductive elements.

5. A compensation network according to claim 3, wherein at least some of the first set of conductive elements are coupled to a metal layer lying above, but electrically isolated from, one of the intermediate metal layers.

6. A compensation network according to claim 1, wherein the bonding bars and/or the conductive elements are made from a metal.

7. A compensation network according to claim 1, wherein the first terminal is the gate or drain of the RF transistor, and the second terminal is the source of the RF transistor.

8. A RF transistor module comprising a RF transistor and a first compensation network according to claim 1, the first bonding bar of the first compensation network being coupled to one of the gate or drain of the RF transistor respectively and the second conductive elements of the first compensation network being coupled to the source of the RF transistor.

9. A RF transistor module comprising: a RF transistor and a first compensation network and a second compensation network according to claim 1, the first bonding bar of the first compensation network being coupled to one of the gate or drain of the RF transistor respectively and the second conductive elements of the first compensation network being coupled to the source of the RF transistor, the first bonding bar of the second compensation network being coupled to the other of the gate or drain of the RF transistor respectively and the second conductive elements of the second compensation network being coupled to the source of the RF transistor.

10. A cellular base station or terrestrial broadcast station comprising an RF transistor module according to claim 8.

11. The compensation network of claim 1, wherein the dielectric material comprises silicon dioxide.

12. A compensation network according to claim 1, wherein each of the second set of vias and the third set of vias comprises only three vias.

13. A compensation network according to claim 6, wherein the metal comprises gold.

* * * * *